LIMITING AMPLIFIER
Filed Nov. 1, 1955
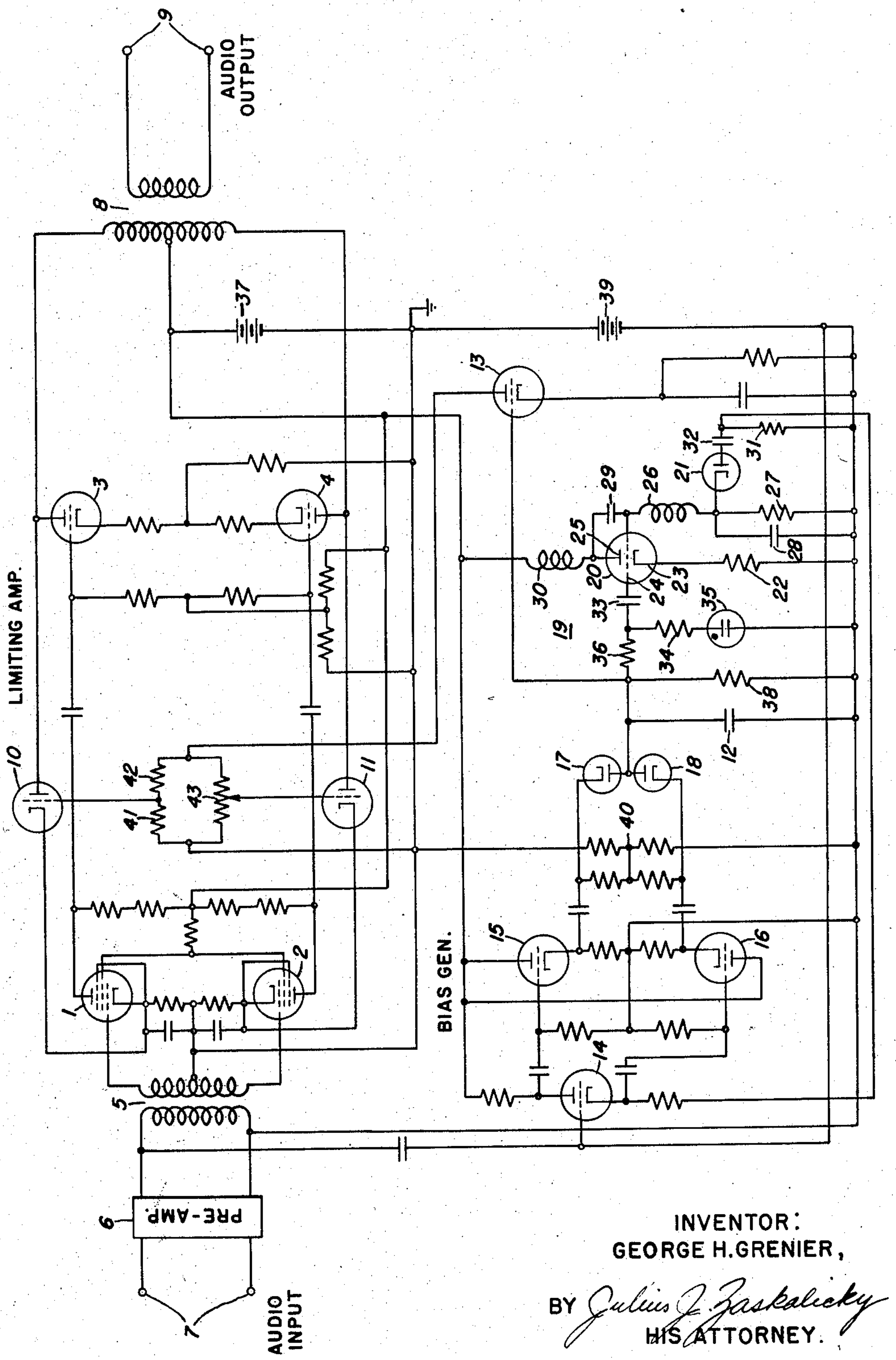
INVENTOR:
GEORGE H. GRENIER,
BY Julius J. Zaskalicky
HIS ATTORNEY.

United States Patent Office 2,883,480

Patented Apr. 21, 1959

2,883,480

LIMITING AMPLIFIER

George H. Grenier, Liverpool, N.Y., assignor to General Electric Company, a corporation of New York Application November 1, 1955, Serial No. 544,178

3 Claims. (Cl. 179—171)

The present invention is directed to amplifiers in general and has as an object thereof to provide improvements in limiting amplifiers.

Limiting amplifiers find extensive application in limiting the amplitude of an audio signal prior to the application thereof to a transmitter to avoid over-modulation of the transmitter. Such a limiting amplifier usually includes a circuit for rectifying the applied signal and applying the rectified signal to the amplifier to vary the gain of the amplifier in inverse relationship to the amplitude of the signal. Such a circuit usually includes a rectifier and resistance capacitance network in the load circuit of the rectifier. In the operation of such a circuit, the capacitance is charged to a large potential on peaks of applied signal thereby appreciably reducing the gain of the amplifier; consequently, should there be an appreciable wait period after the application of other signals, the gain of the amplifier is caused to return to full value, thereby greatly increasing background noise from the output of the amplifier. Occurrence of such signals results in a periodic rise of background noise or low level program material giving rise to an effect commonly called "pumping." Also, if the time constant of the resistance-capacitance network of the above rectifier circuit is made sufficiently large to reduce the aforementioned effects, the program level is excessively depressed.

The present invention is directed to the elimination of such limitations in prior art arrangements.

Another object of the present invention is to provide a simple and effective circuit for returning a limiting amplifier to normal gain only during signal intervals thereby avoiding the adverse effects of increasing gain during the absence of useful signal.

Still another object of the present invention is to provide a limiter circuit in which the recovery of the gain thereof is at a controlled rate in response to reception of signals of smaller amplitude than the signal which initially caused a depression of gain.

In carrying out applicant's invention in one form, a means is provided responsive to amplitudes of audio signals greater than a predetermined amplitude for developing a potential to reduce the gain of the amplifier and to maintain the amplitude of the output of said amplifier less than a second predetermined amplitude. Further means are provided for maintaining the gain of said amplifier at said value for an appreciable time after the disappearance of the signal causing said reduction in gain. Still further means are provided in response to subsequent signals of an amplitude greater than another predetermined amplitude for increasing the gain at a predetermined rate during the occurrence of said subsequent signals.

The novel features which are considered to be characteristic of my invention are set forth with particularity in the appended claims. The invention itself, however, both as to its organization and method of operation together with further objects and advantages thereof may be best understood with reference to the following description taken in connection with the accompanying drawings of a schematic diagram of an embodiment of the present invention.

Referring now to the drawing, there is shown an embodiment of the present invention. The limiting amplifier therein shown comprises an input stage including a pair of electron discharge amplifiers 1 and 2 connected in push-pull relationship and an output stage including electron discharge amplifiers 3 and 4. Amplifiers 1 and 2 are driven by a transformer 5 which in turn is driven by a preamplifier of conventional design 6 having its input connected to a pair of input terminals 7. Output from amplifiers 3 and 4 is applied to output transformer 8, the output of which is supplied to output terminal 9. The gain of the limiting amplifier is controlled by devices 10 and 11 connected in degenerative feed-back loops from amplifier 1 to amplifier 3 and from amplifier 2 to amplifier 4, respectively.

Application of suitable potentials to the grids of devices 10 and 11 controls the amount of negative feedback from the output stage 3 and 4 to the input stage 1 and 2, thereby controlling the gain of the limiting amplifier. The potential utilized for this purpose is obtained across a capacitance 12. The unidirectional potential appearing on capacitance 12 is applied through a D.-C. amplifier 13 to the grids of devices 10 and 11.

The unidirectional potential appearing across capacitance 12 is obtained by rectification of the input signal after it has been suitably amplified by a bias generator including phase splitting device 14 and a pair of push-pull cathode follower devices 15 and 16. The phase splitting device is connected to the output of the preamplifier 6. The output of the phase splitter 14 drives the cathode follower stages 15 and 16 in push-pull. The output from the latter stages are rectified by unilaterally conducting devices 17 and 18, respectively. In the absence of any additional circuitry other than that described in the above paragraphs the undesirable effects mentioned above, that is, pumping, the present background noise and the reduction of average output level are experienced. This invention is directed to elimination of such adverse effects.

An illustrative embodiment of a circuit for eliminating such adverse effects is shown at 19. This circuit functions to cause appreciable decay of this charge on biasing capacitance 12 only during audio signal intervals and at a controlled rate. The circuit 19 comprises a device 20 functioning as a radio frequency oscillator. The device 20 includes a cathode 23, a grid 24 and an anode 25. The cathode 23 is connected through cathode resistance 22 to the negative terminal of source 39, the positive terminal of which is connected to ground. The grid is connected through resonant circuit inductance 26 and resistance 27 to ground. Resistance 27 is shunted by bypass capacitance 28. Grid 24 is also connected through capacitance 29 to the anode 25 which in turn is connected through parallel resonant inductance 30 to the positive terminal of source 37 the negative terminal of which is connected to ground. Oscillation of the device 20 is determined by the bias developed across resistance 27. Bias is developed from audio signals appearing across resistance 31, one terminal of which is connected to ground, the other terminal of which is connected through capacitance 32 to the anode of unilaterally conducting device 21, the cathode of which is connected to the grid side of resistance 27. Accordingly, when an audio voltage of predetermined amplitude is applied across the resistance 31, a bias is developed across resistance 27, which bias causes the oscillator 20 to develop oscillations.

The output of the oscillator 20 is supplied through a discharge circuit to cause the capacitance 12 to discharge only during the appearance of oscillations. The use of radio frequency oscillations produces a more positive action than would be obtained by using any unidirectional or low-frequency alternating potential. The output of the oscillator 20 is applied through coupling capacitor 33 across resistance 34 and glow discharge devices 35. The magnitude of the radio frequency voltage developed is sufficient to cause the glow discharge device 35 to be rendered conductive. Since the glow discharge device 35 is connected in shunt across capacitance 12 through resistance 34 and 36, capacitance 12 is caused to discharge through this circuit whenever the glow tube 35 is caused to conduct. The rate of discharge is determined by the time constant comprising the series combination of resistances 34 and 36, glow discharge tube 35 and the capacitance 12. Resistance 38 shunting capacitance 12 is large in comparison to the other resistances in the discharge circuit.

The operation of applicant's circuit will be apparent from consideration of a particular example. The bias point 40 for the diodes 17 and 18 is arranged such that for all audio voltages less than 2 volts peak appearing across each of the cathode followers, no rectification is had; and consequently no potential developed across capacitance 12. When the voltage exceeds the two volt threshold value, rectification is had and a charge is developed across capacitance 12 in proportion to the magnitude of the applied voltage and a corresponding reduction in gain limiting amplifier is effected through D.-C. amplifier 13 and gain controlling tubes 10 and 11.

When a very large audio voltage is applied to the input of the limiting amplifier, a large voltage is developed across the capacitance 12 which causes a corresponding reduction in gain of the limiting amplifier. In the absence of any further signal being applied to the amplifier, the charge across the capacitance 12 would decay through resistance 38 until the gain of the amplifier is restored to a normal no-signal value. The time constant of the capacitance 12 and the resistance 38 is arranged to be appreciably long, that is, in the order of a minute.

In normal communication, pauses of more than a few seconds are unusual. Accordingly, before the charge on capacitance 12 has had time to decay, additional signals will have been received and appear across the resistance 31, thereby causing oscillations to be developed by the device 20. Application of the oscillations to the glow discharge tube will cause the latter to conduct, thereby initiating a discharge of the capacitance 12. It should be noted that this discharge will occur only during the time that the output is being developed by the device 20 which in turn will be only when a voltage of sufficient magnitude appears across the resistance 31. Rate of discharge of the capacitance 12 and consequently the rate of change of gain of the limiting amplifier is determined by the time constant of the discharge network for this capacitance which is determined by the magnitude of the resistances 34, 36 and the capacitance 12 and resistance of glow tube 35. These resistances are so chosen that the rate of change of gain is not so large as to be appreciably noticeable. It should be noted that with this arrangement a change of gain for all practical purposes is had only during signal intervals; and consequently, the change of gain is less noticeable than if such change were taking place during a no-signal interval, with only background noise present.

It should also be noted that with this arrangement the gain of the limiting amplifier is limited to a certain maximum output and that the amplifier is fast acting to reduce the gain once a large signal tending to produce an output greater than this allowable output. Additionally, it should be noted that any increase in gain from a large reduction of gain is had only during signal intervals and then at a gradual rate, so that the gain of the amplifier tends to move in that direction corresponding to the predominate amplitude of the communication.

Referring now to the limiting amplifier in more detail, the preamplifier 6 may comprise any of a variety of audio-amplifiers, the function of which is to increase the amplitude of the applied signal up to a value suitable for application to the limiting amplifier and may be omitted if signals of sufficient amplitude are otherwise available. The transformer 5 is a conventional coupling transformer for coupling the output of the limiting amplifier 6 to the input of the device 1 and 2. The secondary of the transformers are center tapped to ground, the other ends of which are connected to grids to devices 1 and 2 to drive these devices in push-pull relationship. The cathode devices 1 and 2 are connected to ground through suitable biasing networks. The screen grids of these devices are tied together and are connected through a screen load resistance to the positive terminal of the source of unidirectional potential 37. The anodes of the devices are connected through respective anode load resistances to the positive terminal of the source 37 of unidirectional potential. The anodes of devices 1 and 2 are also connected through coupling capacitances to the grids of devices 3 and 4, respectively. The anodes of devices 3 and 4 are connected to the ends of the primary of transformer 8, the center tap of which is connected to the positive terminal of source 30. The secondary of the transformer is connected to the output terminals 9. Cathodes of devices 3 and 4 are connected through cathode resistances to negative terminal of source 37. The grids of devices 3 and 4 are connected through grid resistances to a bias potential point.

The anode of device 3 is connected to the anode of electron discharge device 10, the cathode of which is connected to the cathode of device 1. Similarly, the anode of device 4 is connected to the anode of device 11, the cathode of which is connected to the cathode of device 2. The grid of device 10 is connected to the junction of resistance 41 and 42 which are connected in series between ground and the anode of device 13. Similarly, the grid of device 11 is connected to a variable tap on resistance 43 which is connected between ground and the anode of D.-C. amplifier 13. The cathode of D.-C. amplifier 13 is connected through a biasing network to the negative terminal of a source of a unidirectional potential 39, the positive terminal of which is connected to ground. The grid of device 13 is connected to one electrode of capacitance 12, the other electrode of which is connected to the negative terminal of source 39.

The output of preamplifier 6 is coupled to the grid of the device 14 which includes a cathode connected through a cathode resistance to the negative terminal of source 39, and an anode connected through an anode load resistance to the positive terminal of source 37. An output of one phase appears across the cathode resistance and an output of an opposite phase appears across the anode resistance. These outputs are coupled to the push-pull cathode follower devices 15 and 16 across respective cathode resistances of which push-pull outputs are obtained. The cathode of device 15 is capacitively coupled to the cathode of unilaterally conducted device 17. Similarly, the cathode of device 16 is capacitively coupled to the cathode of unilaterally conducting device 18. The cathodes of devices 17 and 18 are connected through respective resistances to a bias point 40 such that only voltages exceeding a predetermined value are passed by rectifiers 17 and 18 to charge capacitance 12. The anodes of rectifiers 17 and 18 are connected to the ungrounded end of capacitance 12. The aforementioned predetermined value determines the threshold value below which no limiting value takes place and above which limiting action takes place to limit the gain of the amplifier to less than a predetermined value.

While a particular embodiment of my invention has been shown and described, it is apparent that changes and modifications may be made without departing from the invention in its broader aspects and, therefore, the aim in the appended claims is to cover all such changes and modifications which fall within the true spirit and scope of my invention.

What I claim as new and desire to secure by Letters Patent of the United States is:

1. In combination, in an amplifier for amplifying audio signals, the amplitudes of which vary over a wide range of amplitudes, means for applying said signals to a circuit including a unilaterally conducting device and a capacitance connected in series, a resistance in shunt with said capacitance to form a first discharge circuit for said capacitance, means for applying the potential developed across said capacitance to vary the gain of said amplifier in inverse relationship to the magnitude of said potential, said capacitance also having another discharge circuit in shunt therewith including a resistance in series with a glow discharge tube, the voltages developed across said capacitance by the application of said signals being insufficient to render said glow discharge tube conductive, a radio frequency oscillator, means for applying the output of said oscillator across said glow discharge tube, the amplitude of said output being sufficient to cause conduction therein, said oscillator being responsive to said signals greater than a predetermined value for developing oscillations only during the occurrence of amplitudes of said signals greater than a predetermined value, whereby said glow discharge tube is rendered conductive to cause discharging of said capacitance at a rate determined substantially by the parameters of said second mentioned discharge circuit.

2. In combination, in an amplifier for amplifying audio signals, the amplitudes of which vary over a wide range of amplitudes, means for applying said signals to a circuit including a unilaterally conducting device and a capacitance connected in series, a resistance in shunt with said capacitance to form a first discharge circuit for said capacitance, means for applying the potential developed across said capacitance to vary the gain of said amplifier in inverse relationship to the magnitude of said potential, said capacitance also having another discharge circuit in shunt therewith including a resistance in series with a glow discharge tube, the voltages developed across said capacitance by the application of said signals being insufficient to render said glow discharge tube conductive, a radio frequency oscillator, means for applying the output of said oscillator across said glow discharge tube, the amplitude of said output being sufficient to cause conduction therein, said oscillator being responsive to said signals greater than a predetermined value for developing oscillations only during the occurrence of amplitudes of said signals greater than a predetermined value, whereby said glow discharge tube is rendered conductive to cause discharging of said capacitance at a rate determined substantially by the parameters of said second mentioned discharge circuit, the time constant of said first mentioned discharge network being substantially longer than the duration of normal pauses in audio signals and the time constant of said second mentioned discharge network being substantially shorter than the time constant of said first mentioned discharge network.

3. In combination in an amplifier for amplifying audio signals the amplitude of which varies over a wide range of amplitudes, means responsive only to amplitudes of said signals greater than a predetermined amplitude for reducing the value of gain of said amplifier at a first relatively slow rate with respect to time to thereby prevent excessive background noise on cessations of applied audio, means for maintaining said gain at said reduced gain value as long as said amplitudes of applied signals exist, and means responsive only during the duration of applied audio signals for reducing the gain of said amplifier at a second rate which is relatively fast with respect to said first rate to cause appreciable amplifier gain reduction and relatively slow enough to make the change of gain appreciably less noticeable in no-signal intervals than in signal intervals.

References Cited in the file of this patent

UNITED STATES PATENTS

| | | |
|---|---|---|
| 2,156,846 | Getaz | May 2, 1939 |
| 2,221,541 | Hathaway | Nov. 12, 1940 |
| 2,392,384 | Howard | Jan. 8, 1946 |
| 2,497,691 | Schroeder | Feb. 14, 1950 |